(12) United States Patent
Yang et al.

(10) Patent No.: US 9,172,505 B1
(45) Date of Patent: Oct. 27, 2015

(54) METHODS AND APPARATUS FOR FRAME DETECTION

(71) Applicants: Haiyun Yang, San Jose, CA (US); Ninh D. Ngo, Palo Alto, CA (US)

(72) Inventors: Haiyun Yang, San Jose, CA (US); Ninh D. Ngo, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 83 days.

(21) Appl. No.: 13/624,095

(22) Filed: Sep. 21, 2012

(51) Int. Cl.
*H04L 1/00* (2006.01)
*H04L 25/02* (2006.01)

(52) U.S. Cl.
CPC .......... *H04L 1/0091* (2013.01); *H04L 25/0262* (2013.01)

(58) Field of Classification Search
CPC .............. H03M 13/151; H03M 13/15; H03M 13/1515; G11B 20/1833; H04L 1/0057; H04L 1/0091; H04L 25/0262
USPC .................................. 714/785, 775, 781, 798
See application file for complete search history.

(56) References Cited

U.S. PATENT DOCUMENTS

| | | | | |
|---|---|---|---|---|
| 6,510,486 | B1* | 1/2003 | Knaack et al. | 711/5 |
| 7,103,827 | B2* | 9/2006 | Iwamura | 714/775 |
| 2003/0218774 | A1* | 11/2003 | Masaki | 358/1.16 |
| 2009/0150754 | A1* | 6/2009 | Dohmen et al. | 714/785 |
| 2009/0187808 | A1* | 7/2009 | Nichols | 714/762 |

* cited by examiner

*Primary Examiner* — Albert Decady
*Assistant Examiner* — Kyle Vallecillo
(74) *Attorney, Agent, or Firm* — Okamoto & Benedicto LLP

(57) ABSTRACT

One embodiment relates to a frame detection circuit for detecting a frame boundary. The circuit includes at least two frame buffers and a staged-parallel structure of syndrome computation circuits that computes a number of syndromes in one cycle. The two frame buffers are each one word in width. The number of syndromes computed in one cycle by the cascaded series is a fraction of a number of bits in one word. Another embodiment relates to a method for detecting a frame boundary. Another embodiment relates to a method for computing a current syndrome. Other embodiments, aspects, and features are also disclosed.

23 Claims, 9 Drawing Sheets

METHODS AND APPARATUS FOR FRAME DETECTION

BACKGROUND

1. Technical Field

The present invention relates generally to data networking and communication circuits.

2. Description of the Background Art

Forward error correction (FEC) may be used to correct errors in data transmission over a communication channel. For example, in one implementation of an FEC code as specified in the IEEE 802.3 Clause 74 standard, a transmitter may encode an FEC frame having a total of 2112 bits. Of the 2112 bits, there are 2080 message bits and 32 parity check bits. The frame may be encoded (scrambled) by applying an exclusive-or with a predefined 2112-bit pseudo-random number (PN2112) sequence. Subsequently, at the decoder, the frame may be decoded (descrambled) by applying an exclusive-or with the same predefined PN2112 sequence.

However, before a decoder may start decoding the frame, the decoder needs to find the frame boundary. Searching for the frame boundary in a rapid and resource-efficient manner is a challenging task.

SUMMARY

One embodiment relates to a frame detection circuit for detecting a frame boundary. The circuit includes at least two frame buffers and a staged-parallel structure of syndrome computation circuits that computes a number of syndromes in one cycle. The two frame buffers are each one word in width. The number of syndromes computed in one cycle by the cascaded series is a fraction of a number of bits in one word.

Another embodiment relates to a method of detecting a frame boundary. Two received frames are buffered in buffers that are one word wide. Multiple syndrome computations are performed in one cycle using a staged-parallel structure of syndrome computation circuits. The number of syndrome computations performed in one clock cycle is a fraction of a number of bits in one word.

Another embodiment relates to a method of computing a current syndrome. A head bit from a first received frame, a tail bit from a second received frame, and a previously-computed syndrome are received. The head bit and tail bit are separated by one frame of bits, and the previously-computed syndrome is a candidate frame beginning at the head bit. Syndrome computation circuitry is applied to generate the current syndrome for a candidate frame beginning one bit after the head bit.

Other embodiments, aspects, and features are also disclosed.

DETAILED DESCRIPTION

Figure 1:
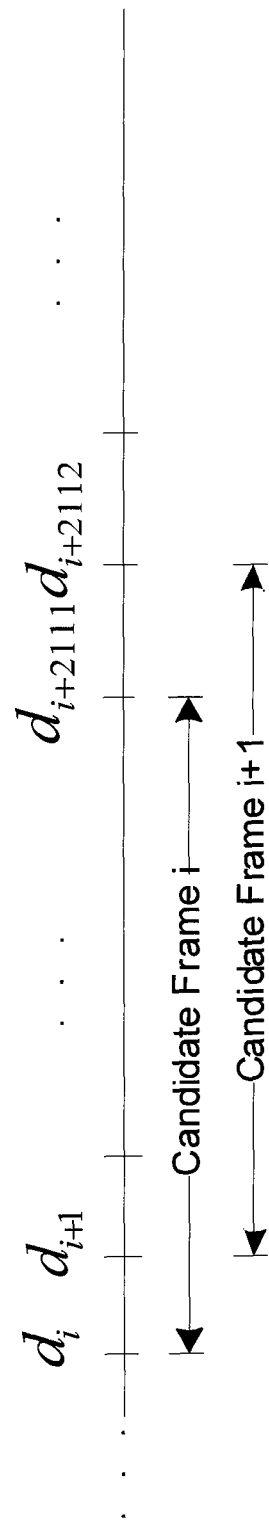
FIG. 1 is a diagram of an input data stream in accordance with an embodiment of the invention.

For purposes explanation, consider the encoded 2112-bit frame described above with 2080 data bits and 32 parity check bits and that is encoded by an exclusive-or with a predefined 2112 bit pseudo-random binary sequence. Prior searching techniques for the receiver to find the frame boundary exist, but they have limitations and disadvantages.

A first technique is suggested in IEEE 802.3 Clause 74. The suggested technique may be referred to as a "brute-force" technique and involves trying sequentially all 2112 possible starting positions for a frame. For each starting position, the received data of the candidate frame is descrambled, and then the syndrome of the candidate frame is computed. If the syndrome is not zero, then the current starting position (i.e. the candidate frame) is not at a frame boundary so long as there are no error bits. In that case, the current starting position will be skipped, and a next starting position will be tried in the same way. This implementation is straightforward. However, the searching time may be very long because it may require trying 2112 starting positions (i.e. 2112 candidate frames) to find the frame boundary in the worst case.

A second technique is described in U.S. Pat. No. 7,103,827 to Iwamura. To reduce the searching time, Iwamura describes a quick search technique. In this technique, the syndrome may be computed for a first candidate frame which, in the example depicted in FIG. 1, starts at bit $d_i$ and ends at bit $d_{i+2111}$. If the syndrome for the first candidate frame, denoted as $S_i(x)$, is not zero, then the syndrome will be computed for a second candidate frame. The second candidate frame starts at a second position which is one bit after (one bit slip from) the first position. Hence, in the example shown in FIG. 1, the second candidate frame starts at bit $d_{i+1}$ and ends at bit $d_{i+2112}$. The syndrome of the second candidate frame, denoted $S_{i+1}(x)$, may be computed in a relatively rapid manner using $S_i(x)$ with one more shifting input for the bit $d_{i+2112}$ at the end of the second candidate frame plus a correction circuit to remove the effect of the bit $d_i$ at the first start position. In other words, only one additional input bit is needed to compute $S_{i+1}(x)$. Similarly, only one additional bit per frame needed to compute the syndrome of the third through $2112^{th}$ candidate frames, denoted $S_{i+2}(x)$ through $S_{i+2111}(x)$. Hence, to compute the syndromes for all 2112 candidate frames only two frames of bits are needed: the first frame of bits $d_i$ through $d_{i+2111}$; and a second frame of bits $d_{i+2112}$ through $d_{i+4223}$.

Thus, while the first (brute-force) technique may require calculating the syndrome for up to 2112 frames of bits, the Iwamura technique needs, in effect, only two frames of bits. However, the Iwamura technique requires a correction circuit to remove the effect of the bit at the start position of the previous candidate frame. In addition, the Iwamura technique needs to buffer one frame of bits (in our example, bits $d_{i+2112}$ through $d_{i+4223}$).

Applicants have determined that the serial bit processing disclosed in Iwamura becomes an issue at very high data rates. For example, in 10GBASE-R Ethernet, the bit rate is approximately 10.3 GHz (and may be run at an even faster bit rate, such as over 25 GHz, if desired).

To satisfy such a high data rate, the frame synchronization and the FEC decoder may use a multiple-bit word input (for example, a 64-bit word input). In that case, the frame synchronization and the FEC decoder can only run at a fraction of the input bit rate (for example, $1/64^{th}$ of the 10.3 GHz rate).

The serial bit processing of Iwamura may be extended to use such a multiple-bit word input. However, when the width of the word is large, a large number of correction circuits are required. For example, if the word width is 64, then 64 correction circuits are required according to Iwamura. In addition, 64 zero syndrome detection circuits would be required. One frame of bits would still need to be buffered, but the buffer shape would be 64 bits wide×33 bits deep. Thus, although extending the technique of Iwamura to a multiple-bit parallel input format may achieve block detection at a high data rate, the cost is also very high in terms of the additional required circuits.

The present disclosure provides innovative methods and circuitry to achieve an advantageous balance between fast frame detection and circuit complexity. In accordance with an embodiment of the invention, a staged-parallel structure of syndrome computation circuits is provided. Given a preceding syndrome and select bits from two frame buffers, the staged-parallel structure of syndrome computation circuits computes a next several syndromes at a time in a resource-efficient manner. In accordance with an embodiment of the invention, the number of syndromes computed by the staged-parallel structure in one clock cycle is a fraction of the number of bits in an input word.

For purposes of a concrete example, consider an embodiment with a 64-bit parallel input format (i.e a 64-bit input word). In this case, two frame buffers that are to be used may have buffer shapes of 64 bits wide×33 bits deep. Other embodiments may use parallel input formats (and corresponding buffer shapes) that may have a different width (other than 64 bits).

An initial syndrome $S_i(x)$ may be computed by initial syndrome computation circuitry in parallel with buffering the first frame of bits. The initial syndrome computation circuitry may be implemented using a conventional circuit structure and may take 33 clock cycles or one frame of clock cycles to complete.

Subsequently, for each clock cycle, instead of computing all 64 syndromes at a time per the technique of Iwamura, only a fraction of the 64 syndromes are computed at a time. For example, in one embodiment, four of the 64 syndromes may be computed at a time. In another embodiment, eight of the 64 syndromes may be computed at a time. In other embodiments, other fractions may be computed at a same time.

By computing only a fraction of a word-width of syndromes in a single clock cycle, the circuit complexity is reduced substantially compared with Iwamura. As a trade-off, the maximum searching time is increased compared to the Iwamura technique, although it remains substantially shorter than the maximum searching time of the first (brute-force) technique described above.

For purposes of explanation, consider the input data as shown in FIG. 1. For candidate frame i, the received signal may be expressed in polynomial form as follows.

$$D_i(x)=d_i*x^{2111}+d_{i+1}*x^{2110}+\ldots+d_{i+2110}*x+d_{i+2111} \quad \text{(Eq. 1)}$$

The syndrome of candidate frame i may be computed as follows.

$$S_i(x)=D_i(x)*x^{40907} \bmod g(x) \quad \text{(Eq. 2)}$$

where g(x) is the generation polynomial, and mod g(x) refers to applying modulo g(x) to $D_i(x)*x^{40907}$. Similarly, for candidate frame i+1, the received polynomial is given by $$D_{i+1}(x)=d_{i+1}x^{2111}+d_{i+2}*x^{2110}+\ldots d_{i+2111}x+d_{i+2112} \quad \text{(Eq. 3)}$$

The syndrome of candidate frame i+1 may be computed as follows.

$$S_{i+1}(x)=D_{i+1}(x)*x^{40907} \bmod g(x) \quad \text{(Eq. 4)}$$

From Eq. 1 and Eq. 3, we may determine that $D_{i+1}(x)$ may be expressed as a function of $D_i(x)$ as follows. (Note, in deriving Eq. 5, that all coefficients of the polynomial are effectively modulo 2 such that + and − operations are equivalent.)

$$D_{i+1}(x)=D_i(x)*x+d_i*x^{2112}+d_{i+2112} \quad \text{(Eq. 5)}$$

Next, replace $D_{i+1}(x)$ in Eq. 4 with the expression in Eq. 5 and consider Eq. 2 to arrive at the following. (Note, in deriving Eq. 6, that due to the mod g(x) being applied to the entire right-side of Eq. 4, we can replace x $S_i(x)$ with x $S_i(x)$ mod g(x) in the first term on the right-side of Eq. 6.)

$$S_{i+1}(x)=(xS_i(x) \bmod g(x))+d_i*(x^{43019} \bmod g(x))+d_{i+2112}*(x^{40907} \bmod g(x)) \quad \text{(Eq. 6)}$$

Consider the terms in Eq. 6. The first term x $S_i(x)$ mod g(x) corresponds to $S_i(x)$ with one-bit right circular shifting. The polynomial part in the second and third terms may be defined as follows.

$$x^{43019} \bmod g(x)=u(x)=\Sigma_{i=0}^{31} u_i*x^i \quad \text{(Eq. 7)}$$

$$x^{40907} \bmod g(x)=v(x)=\Sigma_{i=0}^{31} v_i*x^i \quad \text{(Eq. 8)}$$

In accordance with an embodiment of the invention, u(x) and v(x) may be pre-computed. The values of $d_i$ and $d_{i+2112}$ (i.e. whether each is 0 or 1) determines whether u(x) and v(x) impact $S_{i+1}(x)$.

We may define $S_i(x)$ as follows.

$$S_i(x)=\Sigma_{j=0}^{31} s_{i,j}*x^j \quad \text{(Eq. 9)}$$

Using the above definition of the 32-bit syndrome, we find that the first term of Eq. 6 may be expressed as follows.

$$xS_i(x) \bmod g(x)=\Sigma_{j=0}^{30} s_{i,j}*x^{j+1}+s_{i,31}x^{32} \bmod g(x) \quad \text{(Eq. 10)}$$

The second term in Eq. 10 may be expressed as follows.

$$s_{i,31}x^{32} \bmod g(x)=s_{i,31}(g_0+g_1x+g_2x^2+\ldots+g_{31}x^{31}) \quad \text{(Eq. 11)}$$

Figure 2:
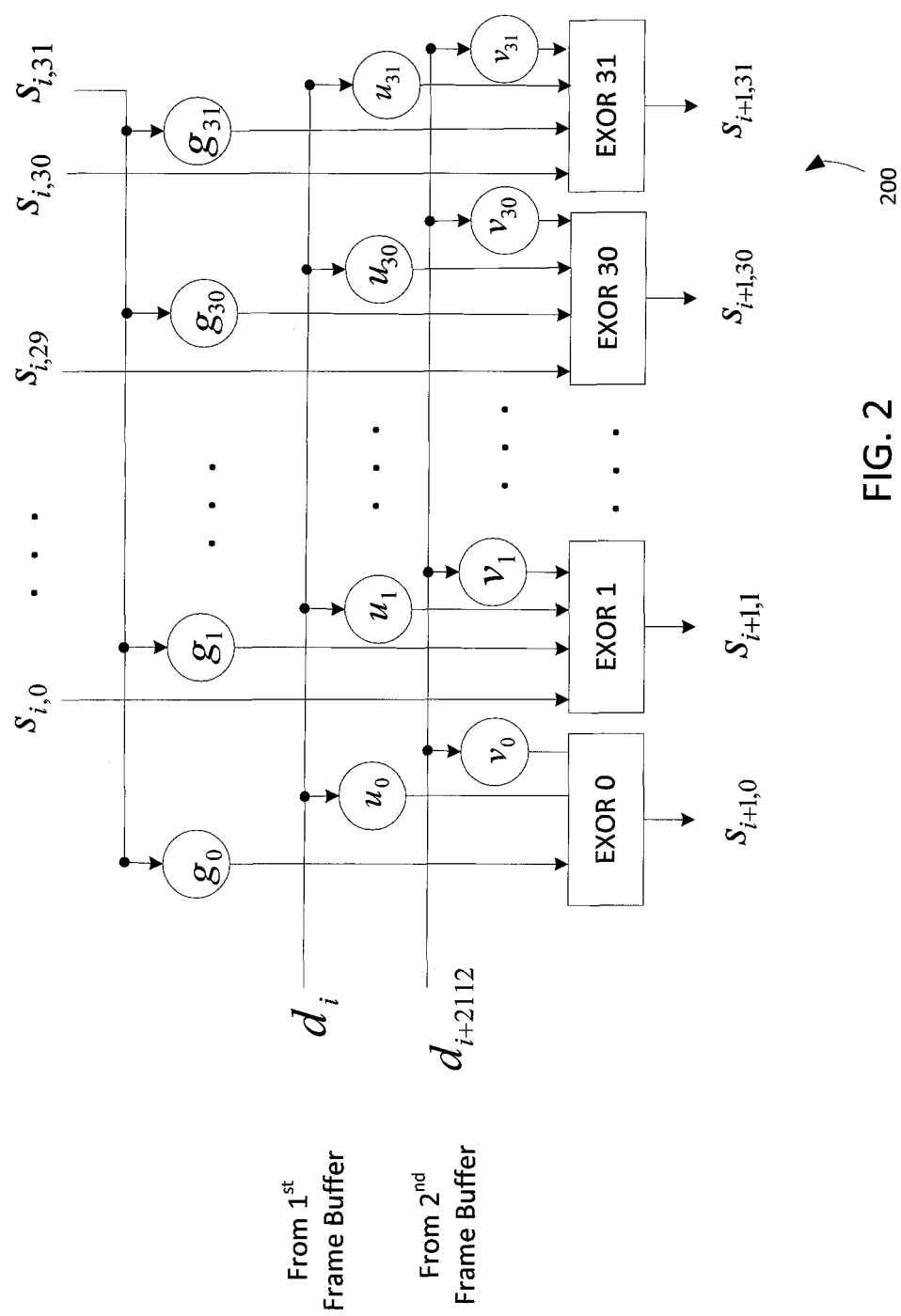
FIG. 2 depicts a syndrome computation circuit module in accordance with an embodiment of the invention.

A circuit 200 to compute $S_{i+1}(x)$ from $S_i(x)$ is shown in FIG. 2. The circuit 200 is structured based on Equations 6, 7, 8, 10 and 11. The circuit 200 includes thirty-two EXOR logic elements EXOR 0 through EXOR 31. The inputs to EXOR 0 are $S_{i,31} g_0$, $d_i u_0$, and $d_{i+2112} v_0$, and the output is $S_{i+1,0}$. The inputs to EXOR 1 are $S_{i,0}$, $S_{i,31} g_1$, $d_i u_1$, and $d_{i+2112} v_1$, and the output is $S_{i+1,1}$. And so on. The inputs to EXOR 30 are $S_{i,29}$, $S_{i,31} g_{30}$, $d_i u_{30}$, and $d_{i+2112} v_{30}$, and the output is $S_{i+1,30}$. Finally, the inputs to EXOR 31 are $S_{i,30}$, $S_{i,31} g_{31}$, $d_i u_{31}$, and $d_{i+2112} v_{31}$, and the output is $S_{i+1,31}$.

While the circuit 200 in FIG. 2 may be used to compute $S_{i+1}(x)$ based on inputs $S_i(x)$, $d_i$ and $d_{i+2112}$, the same circuit 200 may also be used to compute $S_{i+2}(x)$ based on inputs $S_{i+1}(x)$, $d_{i+1}$ and $d_{i+2113}$. Similarly, the same circuit 200 may also be used to compute $S_{i+3}(x)$ based on inputs $S_{i+2}(x)$, $d_{i+2}$ and $d_{i+2114}$, and so on.

Figure 3:
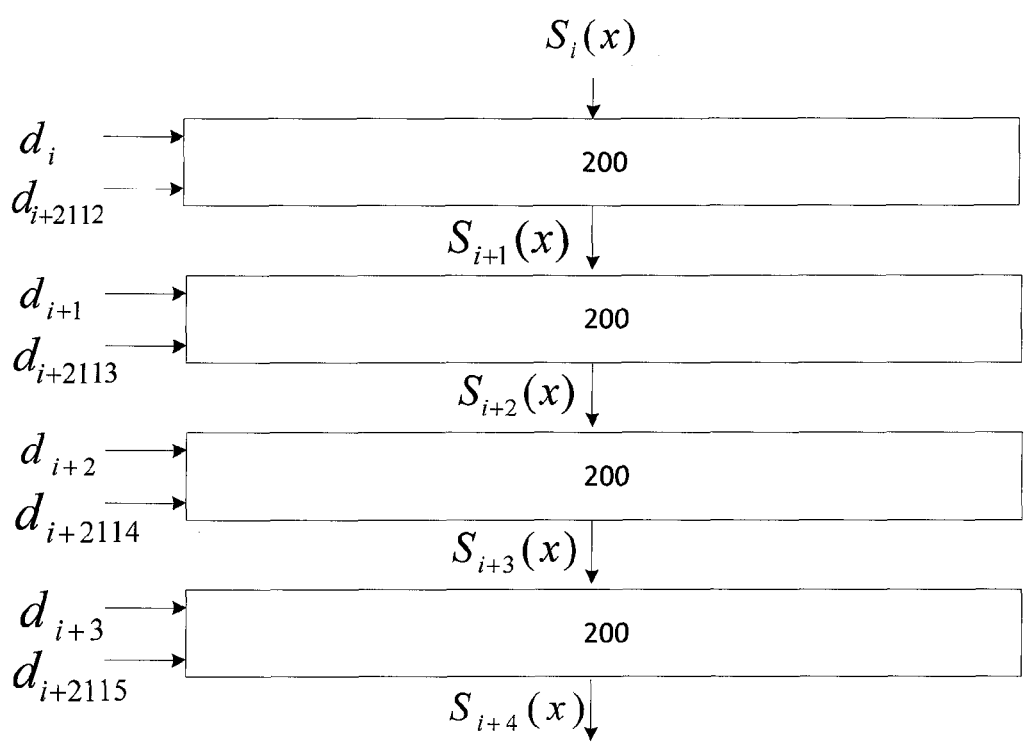
FIG. 3 depicts a staged-parallel structure for computing a plurality of syndromes in accordance with an embodiment of the invention.

In accordance with an embodiment of the invention, staged-parallel structure 300 having four syndrome computation circuits 200 for computing $S_{i+1}(x)$, $S_{i+2}(x)$, $S_{i+3}(x)$ and $S_{i+4}(x)$ is depicted in FIG. 3. Each syndrome computation circuit (circuit stage) 200 in FIG. 3 corresponds to one instance of the circuit 200 in FIG. 2. In accordance with an embodiment of the invention, the number of circuit stages 200 in the staged-parallel structure 300 is a fraction of the width in parallel bits in the input (i.e. the number of bits in an input word).

Figure 4:
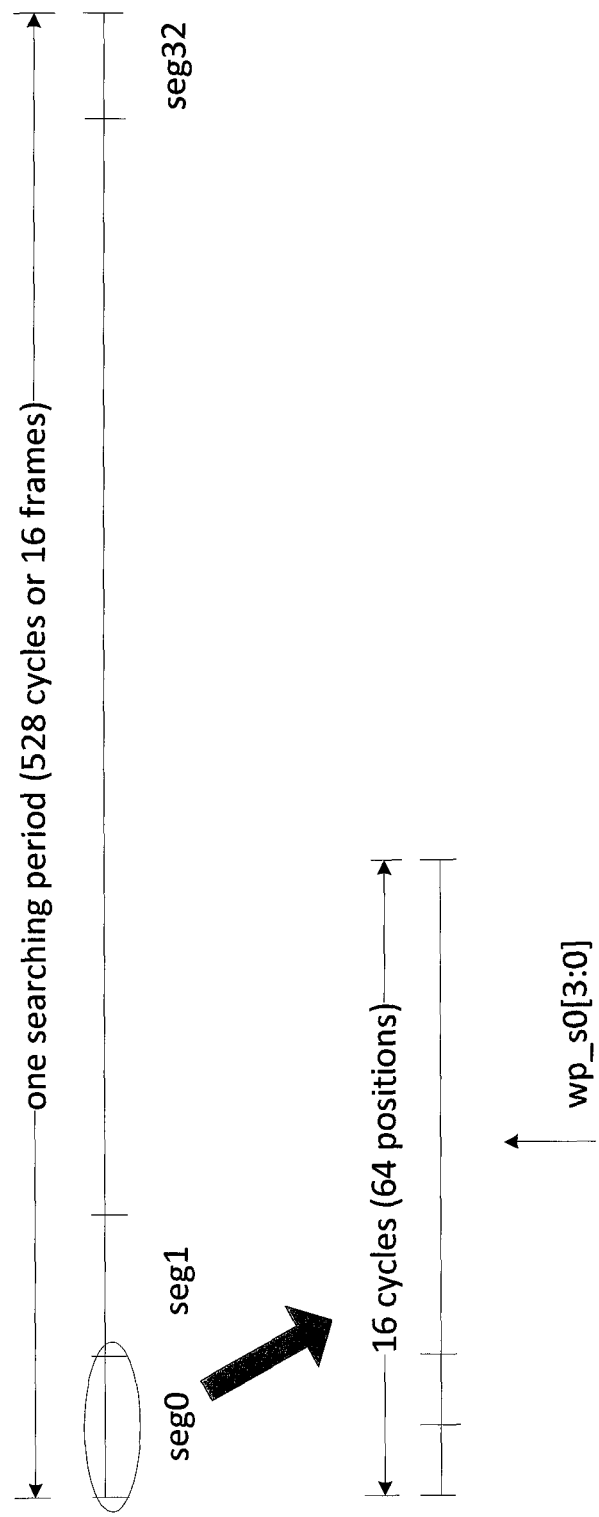
FIG. 4 depicts a searching period for finding a frame boundary in accordance with an embodiment of the invention.

Using the four-stage structure 300 of FIG. 3, the searching procedure that is illustrated in FIG. 4 may be applied. Note that, in this embodiment, there is a 64-bit parallel input format (i.e. a 64-bit input word). As shown in FIG. 4, the searching period includes 33 segments (seg0 through seg32). As further shown, it takes 16 cycles to compute 64 syndromes (corresponding to 64 possible start positions) in each segment. In other words, four syndromes are computed per cycle. The searching period is thus 33 segments×16 cycles per segment=528 cycles=16 frames (at 33 cycles per frame) in the worst case In accordance with an embodiment of the invention, the four syndrome computations per cycle may be accomplished using the four-stage structure 300 of FIG. 3. The output wp_s0[0:3] in FIG. 4 indicates which, if any, of the four syndromes, $S_{i+1}(x)$, $S_{i+2}(x)$, $S_{i+3}(x)$ and $S_{i+4}(x)$, matches a value expected for a frame boundary. If the syndrome computation is performed after descrambling, then the syndrome is determined to be a match if it is zero. On the other hand, if the syndrome computation is performed before descrambling, then the syndrome is determined to be a match if it is equal to pn(x) mod g(x), where pn(x) is the polynomial for PN2112.

In other words, in an embodiment where the syndrome calculations are performed on the descrambled data, then a syndrome value of zero indicates that a frame boundary has been detected. In this embodiment, the searching looks for $S_{i+j}(x)=0$ (j=1, 2, 3 and 4) in order to detect a frame boundary.

In the alternate embodiment where the syndrome computations are performed on the scrambled data, then a syndrome value of pn(x) mod g(x), where pn(x) indicates that a frame boundary has been detected. In this embodiment, the searching looks for $S_{i+j}(x)=pn(x)$ mod g(x) (j=1, 2, 3 and 4) in order to detect a frame boundary. This alternate embodiment may be implemented by bypassing the descrambler during the searching stage.

In order to perform the 64 syndrome computations for each segment, two 64-bit words are read from memory. The first 64-bit word read from memory relates to the "head" portion ($d_i$, $d_{i+i}$, $d_{i+62}$, $d_{i+63}$). The second 64-bit word read from memory relates to the "tail" portion ($d_{i+2112}$, $d_{i+2113}$, . . . , $d_{i+4222}$, $d_{i+4223}$).

During each cycle, a preceding (previously-computed) syndrome and eight bits (four bits from the first word and four bits from the second word) are input into the four-stage structure 300 of FIG. 3. The structure 300 then computes the next four syndromes immediately following the preceding syndrome. In this way, during each segment (which includes 16 cycles), sixty-four (4×16) syndromes may be computed. The searching period for the remaining syndromes (after the initial syndrome computation) is thus 33 segments×16 cycles per segment=528 cycles=16 frames (at 33 cycles per frame). Hence, a total searching time of 17 frames of 33 cycles each is needed for the four-stage structure 300: 1 frame to compute the initial syndrome; and 16 frames to compute the remaining syndromes.

Compared to the multiple-bit parallel extension to the Iwamura structure, the four-stage structure 300 described above has a longer searching time (17 frames of 33 cycles each for the four-stage structure 300 compared to 2 frames of 33 cycles each for the parallel extension to the Iwamura structure). However, the four-stage structure 300 is advantageous in that it takes up substantially less area on an integrated circuit.

Another difference is that the staged-parallel structures disclosed herein generally need to buffer two frames of data while the multiple-bit parallel extension to the Iwamura structure only needs to buffer one frame of data. However, in certain decoder implementations, the decoder itself needs to buffer two frames of data. In such implementations, the need to buffer two frames of data is basically already taken care of and so is not an extra cost.

Although the above description is based on a particular (2112, 2080) FEC code and a 64-bit parallel input format, the presently-disclosed technique may be used for any cyclic and short cyclic codes and may be used with different input formats (any $2^n$-bit parallel input format, for example). In addition, while there are four syndrome computation circuits (four circuit stages) in the staged-parallel structure in the embodiment of FIG. 3, the number of circuit stages is not limited to being four. Various numbers of circuit stages may be implemented.

Figure 5:
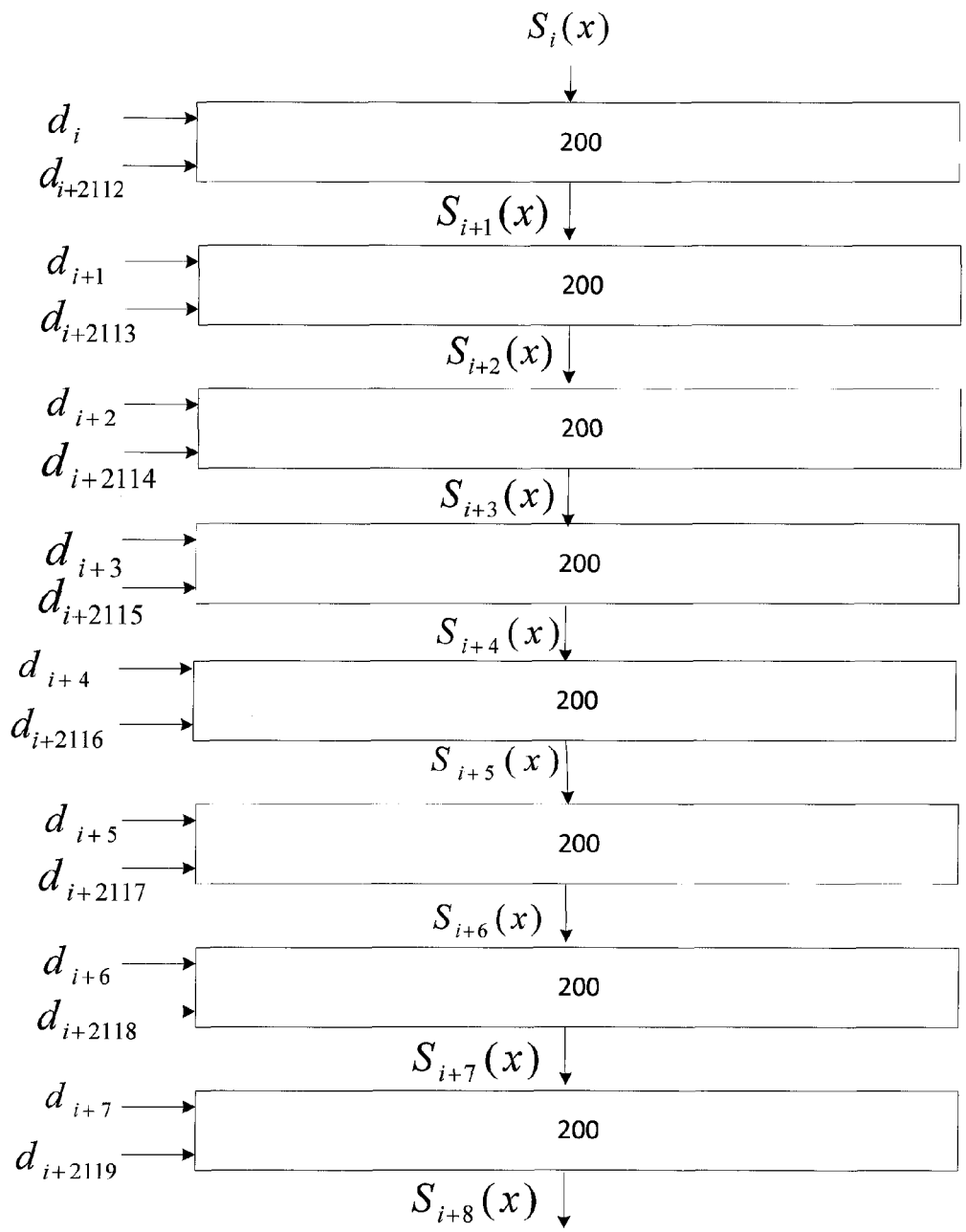
FIG. 5 depicts a staged-parallel structure for computing a plurality of syndromes in accordance with another embodiment of the invention.

In one alternate embodiment, an eight-stage staged-parallel structure 500 may be implemented as shown in FIG. 5. As depicted, the eight stages compute $S_{i+1}(x)$, $S_{i+2}(x)$, $S_{i+3}(x)$, $S_{i+4}(x)$, $S_{i+5}(x)$, $S_{i+6}(x)$, $S_{i+7}(x)$, and $S_{i+8}(x)$.

Figure 6:
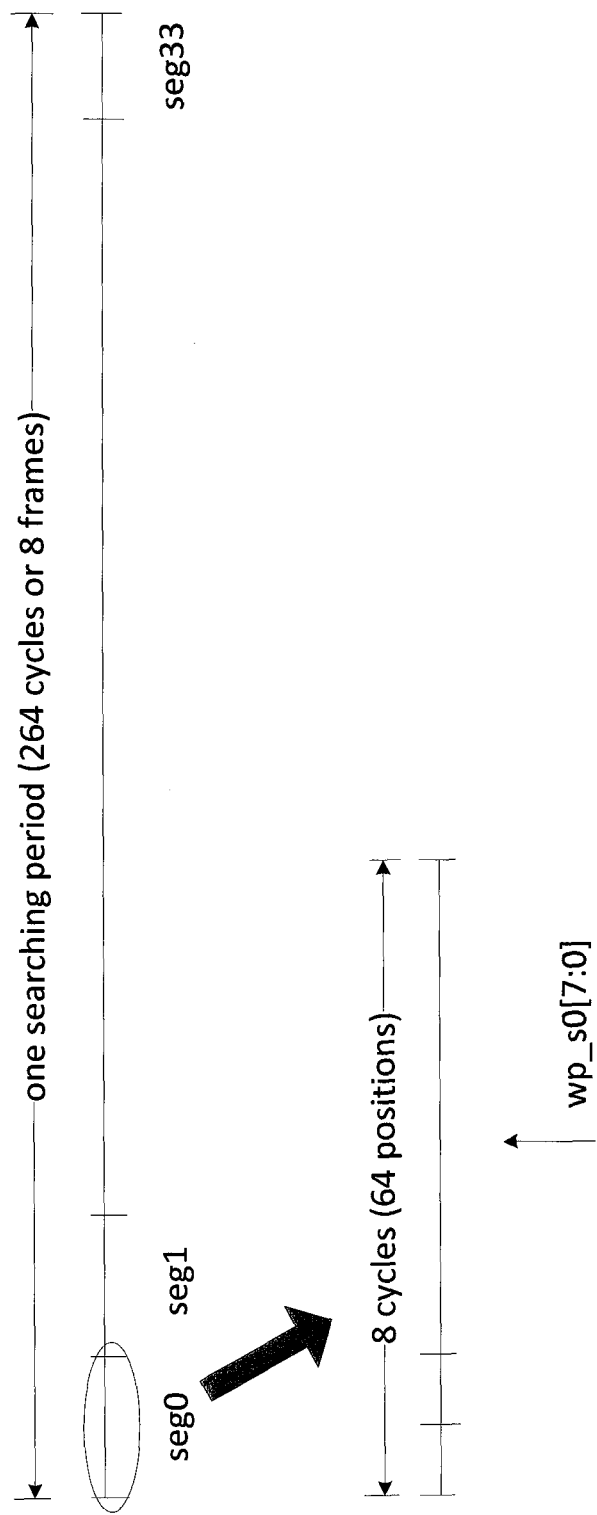
FIG. 6 depicts a searching period for finding a frame boundary in accordance with another embodiment of the invention.

Using the circuit 500 of FIG. 5, the searching procedure that is illustrated in FIG. 6 may be applied. Note again that, in this embodiment, there is a 64-bit parallel input format. As shown in FIG. 6, the searching period includes 33 segments (seg0 through seg32). As further shown, it takes 8 cycles to compute 64 syndromes (corresponding to 64 possible start positions) in each segment. In other words, eight syndromes are computed per cycle. The searching period for the remaining syndromes (after the initial syndrome computation) is thus 33 segments×8 cycles per segment=264 cycles=8 frames (at 33 cycles per frame). Hence, a total searching time of 9 frames of 33 cycles each is needed for the four-stage structure 500: 1 frame to compute the initial syndrome; and 8 frames to compute the remaining syndromes.

In accordance with an embodiment of the invention, the eight syndrome computations per cycle may be accomplished using the eight-stage structure 500 of FIG. 5. The output wp_s0[0:7] in FIG. 6 indicates which, if any, of the eight syndromes is a match. As discussed above, if the syndrome computation is performed after descrambling, then the syndrome is a match if it is zero. On the other hand, if the syndrome computation is performed before descrambling, then the syndrome is a match if it is equal to pn(x) mod g(x).

In order to perform the 64 syndrome computations for each segment, two 64-bit words are read from memory. The first 64-bit word read from memory relates to the "head" portion ($d_i$, $d_{i+62}$, $d_{i+63}$). The second 64-bit word read from memory relates to the "tail" portion ($d_{i+2112}$, $d_{1+2113}$, . . . , $d_{i+4222}$, $d_{i+4223}$).

During each cycle, a preceding (previously-computed) syndrome and sixteen bits (eight bits from the first word and eight bits from the second word) are input into the circuit 500 of FIG. 5. The circuit 500 then computes the next eight syndromes immediately following the preceding syndrome. In this way, during each segment (which includes 8 cycles), sixty-four (8×8) syndromes may be computed.

Compared to the parallel extension of the Iwamura structure, the eight-stage circuit structure described above has a longer searching time (9 frames of 33 cycles each for the eight-stage structure compared to 2 frames of 33 cycles each for the parallel extension of the Iwamura structure). However, the eight-stage structure 500 is advantageous in that it takes up much less area on an integrated circuit.

Figure 7:
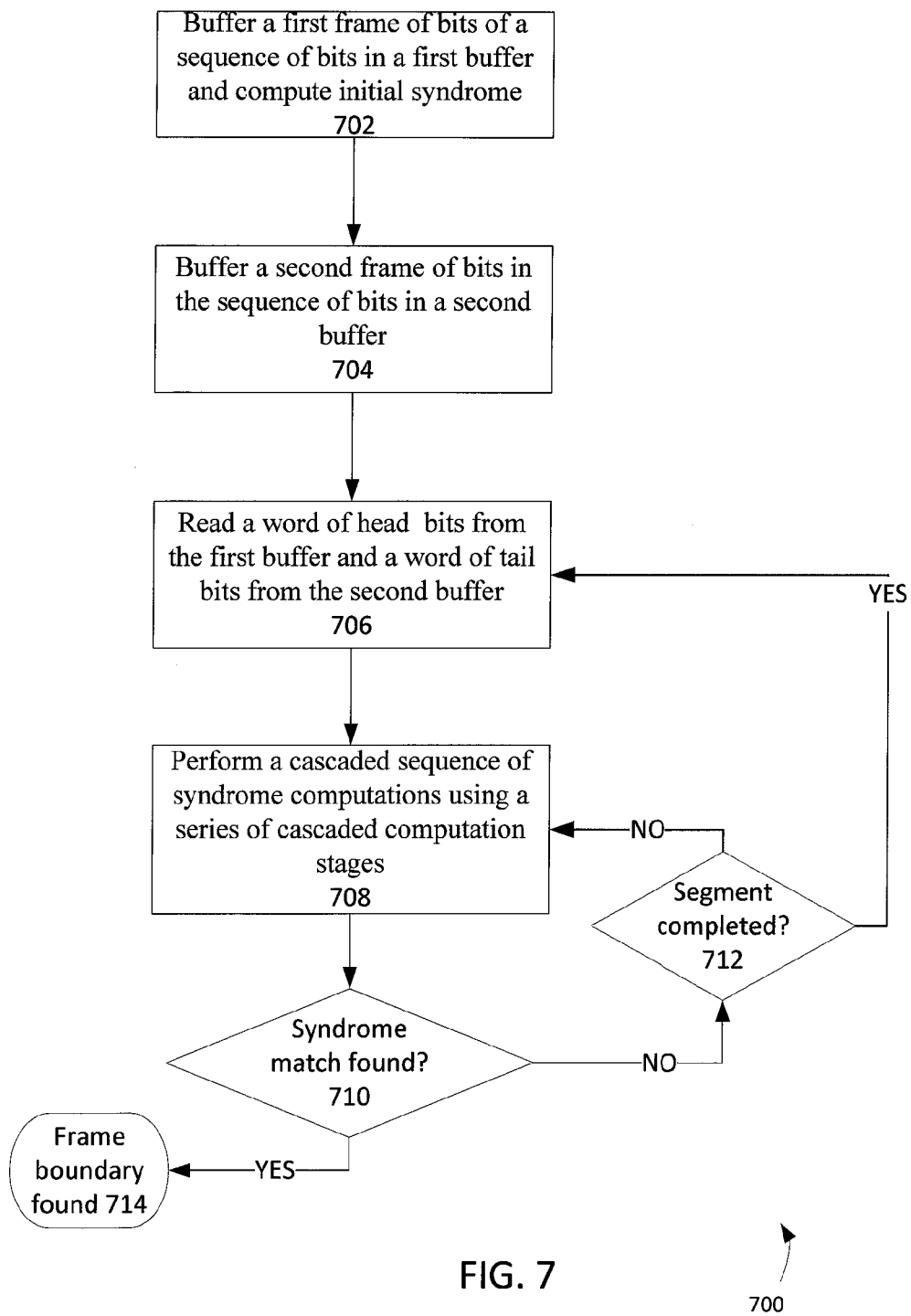
FIG. 7 is a flow chart of a method for cyclic block code detection in accordance with an embodiment of the invention.

FIG. 7 is a flow chart of a method 700 for cyclic block code detection in accordance with an embodiment of the invention.

The cyclic block code detection may be performed on an input sequence of bits received in a one-word-wide parallel input format.

As shown, a first frame of bits of the input sequence is buffered in a first buffer per block 702, and a second subsequent frame of bits of the input sequence is buffered in a second buffer per block 704. The first and second buffers are preferably one word wide to match the parallel input. (Note that the first buffer and the second buffer may be from a single memory structure or separate memory structures.) In conjunction with the loading of the first frame per block 702, an initial syndrome based on the first frame may be computed using a conventional technique.

Per block 706, a word of head bits from the first buffer and a corresponding word of tail bits from the second buffer may be read. These words are to be used to perform syndrome computations for a corresponding segment of the input sequence.

Per block 708, staged-parallel syndrome computations may be performed using a staged-parallel structure of syndrome computation circuits. In accordance with an embodiment of the invention, the number of stages in the structure (and, hence, the number of syndrome computations performed at one time) is a fraction of the word width. The number of stages in the structure may be preferably a power of two (i.e. $2^n$, where n is any counting number). Example implementations of the staged-parallel structure are described above in relation to FIGS. 3 and 5. The inputs into the staged-parallel structure include a preceding syndrome, the head word from the first buffer, and the tail word from the second buffer.

Per block 710, a determination may be made as to whether or not a syndrome match is found by the syndrome computations of block 708. As discussed above, if the syndrome computations are performed on descrambled candidate frames, then a syndrome match is found if a syndrome value of zero is found. Alternatively, if the syndrome computations are performed on scrambled candidate frames (i.e. before descrambling), then a syndrome match is found if a syndrome value is equal to $pn(x) \mod g(x)$. If a syndrome match was found, then the frame boundary has been found, per block 714, at the start position associated with the zero syndrome.

If no syndrome match was found, then a determination may be made, per block 712, as to whether the search of the current segment has been completed. If the search of the current segment has not been completed, then the method 700 may loop back to block 708 and perform a next set of syndrome computations. Otherwise, if the current segment has been completed, then the method 700 may loop back to block 706 and read the next word of head bits from the first buffer and the next word of tail bits from the second buffer.

Figure 8:
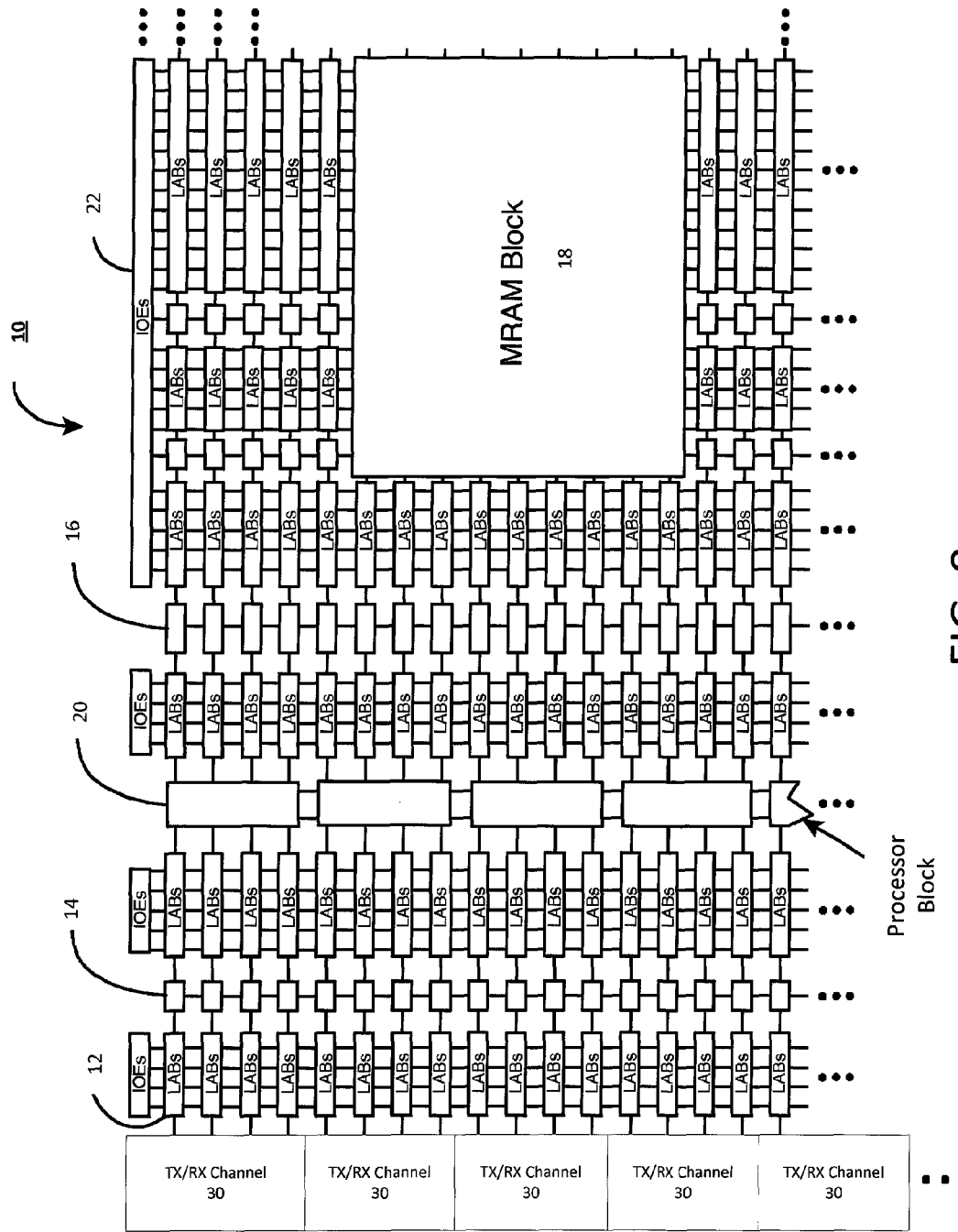
FIG. 8 is a simplified partial block diagram of an exemplary field programmable gate array (FPGA) that may be configured to implement an embodiment of the present invention.

FIG. 8 is a simplified partial block diagram of an exemplary field programmable gate array (FPGA) 10 that may be configured to implement an embodiment of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), digital signal processors (DSPs) and application specific integrated circuits (ASICs).

FPGA 10 includes within its "core" a two-dimensional array of programmable logic array blocks (or LABs) 12 that are interconnected by a network of column and row interconnect conductors of varying length and speed. LABs 12 include multiple (e.g., ten) logic elements (or LEs). A LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 10 may also include a distributed memory structure including random access memory (RAM) blocks of varying sizes provided throughout the array. The RAM blocks include, for example, blocks 14, blocks 16, and block 18. These memory blocks can also include shift registers and FIFO buffers. FPGA 10 may further include one or more embedded processor blocks 20, which may be, for example, be digital signal processors or other types of processors.

Input/output elements (IOEs) 22 located, in this example, around the periphery of the chip support numerous single-ended and differential input/output standards. Each IOE 22 is coupled to an external terminal (i.e., a pin) of FPGA 10.

A transceiver (TX/RX) channel array may be arranged as shown, for example, with each TX/RX channel circuit 30 being coupled to several LABs. Each TX/RX channel circuit 30 may include, among other circuitry, a receiver circuit with frame detection circuitry disclosed herein.

It is to be understood that FPGA 10 is described herein for illustrative purposes only and that the present invention can be implemented in many different types of PLDs, FPGAs, and ASICs.

Figure 9:
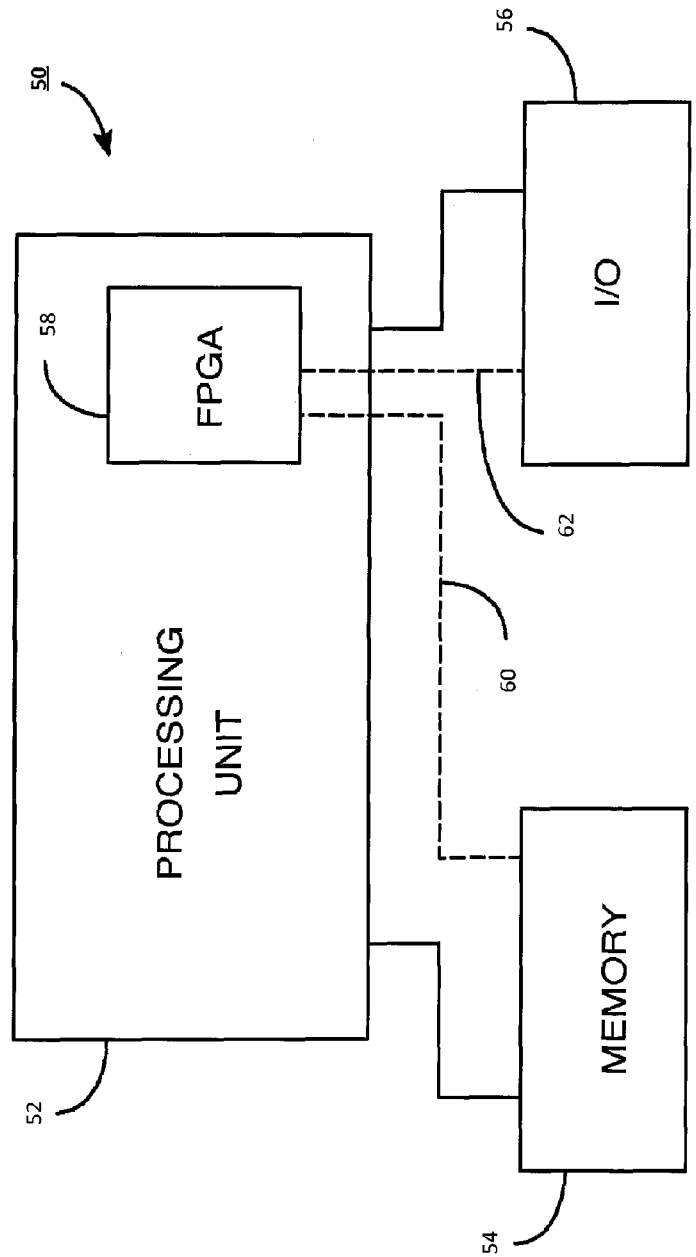
FIG. 9 shows a block diagram of an exemplary digital system that may employ techniques as disclosed herein.

FIG. 9 shows a block diagram of an exemplary digital system 50 that may employ techniques disclosed herein. System 50 may be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 50 may be provided on a single board, on multiple boards, or within multiple enclosures.

System 50 includes a processing unit 52, a memory unit 54, and an input/output (I/O) unit 56 interconnected together by one or more buses. According to this exemplary embodiment, FPGA 58 is embedded in processing unit 52. FPGA 58 can serve many different purposes within the system 50. FPGA 58 can, for example, be a logical building block of processing unit 52, supporting its internal and external operations. FPGA 58 is programmed to implement the logical functions necessary to carry on its particular role in system operation. FPGA 58 can be specially coupled to memory 54 through connection 60 and to I/O unit 56 through connection 62.

Processing unit 52 may direct data to an appropriate system component for processing or storage, execute a program stored in memory 54, receive and transmit data via I/O unit 56, or other similar function. Processing unit 52 may be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 58 may control the logical operations of the system. As another example, FPGA 58 acts as a reconfigurable processor that may be reprogrammed as needed to handle a particular computing task. Alternately, FPGA 58 may itself include an embedded microprocessor. Memory unit 54 may be a random access memory (RAM), read only memory (ROM), fixed or flexible disk media, flash memory, tape, or any other storage means, or any combination of these storage means.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A frame detection circuit for detecting a frame boundary in a sequence of bits, the circuit comprising:
    a first buffer for storing a first received frame of bits, wherein a width of the first buffer is a number of bits in one word in the sequence of bits;
    a second buffer for storing a second received frame of bits, wherein a width of the second buffer is the number of bits in the one word; and
    a staged-parallel structure of syndrome computation circuits that computes a number of syndromes in one cycle, wherein the number of the syndromes computed in one cycle is a fraction of the number of bits in the one word, and wherein each syndrome computation circuit in the staged-parallel structure has inputs consisting of a preceding syndrome, a head bit from the first received frame and a tail bit from the second received frame.

2. The frame detection circuit of claim 1, wherein the positions of the head and tail bits are one frame length apart in the sequence of bits.

3. The frame detection circuit of claim 1, wherein the preceding syndrome is based on a candidate frame beginning at the head bit.

4. The frame detection circuit of claim 3, wherein each syndrome computation circuit computes a current syndrome which is based on a candidate frame beginning one bit after the head bit.

5. The frame detection circuit of claim 1 further comprising:
    initial syndrome computation circuitry to compute an initial syndrome based on the first received frame.

6. The frame detection circuit of claim 1 further comprising, for each segment of a plurality of segments:
    circuitry for reading a word of head bits from the first received frame; and
    circuitry for reading a word of tail bits from the second received frame.

7. The frame detection circuit of claim 1, wherein a number of the syndrome computation circuits in the staged-parallel structure is $2^n$, where n is a counting number of two or more.

8. The frame detection circuit of claim 1, wherein a maximum number of cycles needed to search for the frame boundary, after an initial syndrome computation, is a number of bits in a frame divided by a number of the syndrome computation circuits in the staged-parallel structure.

9. A method of detecting a frame boundary in a sequence of bits, the method comprising:
    buffering a first received frame in a first buffer, wherein a width of the first buffer is a number of bits in one word in the sequence of bits;
    buffering a second received frame in a second buffer, wherein a width of the second buffer is the number of bits in the one word; and
    performing, by a staged-parallel structure of syndrome computation circuits, a plurality of syndrome computations in one cycle, wherein a number of the syndrome computations performed in one cycle is a fraction of the number of bits in the one word, wherein each syndrome computation circuit in the staged-parallel structure has inputs consisting of: a preceding syndrome; a head bit from the first received frame; and a tail bit from the second received frame.

10. The method of claim 9, wherein the positions of the head and tail bits are one frame apart in the sequence of bits.

11. The method of claim 9, wherein the preceding syndrome is based on a candidate frame beginning at the head bit.

12. The method of claim 9, further comprising:
    computing an initial syndrome based on the first received frame.

13. The method of claim 9, wherein the plurality of syndrome computations is performed in segments, each segment including a number computations equal to a number of bits in one word.

14. The method of claim 13 further comprising, for each segment:
    reading a word of head bits from the first received frame; and
    reading a word of tail bits from the second received frame.

15. The method of claim 9, wherein a number of the syndrome computation circuits in the staged-parallel structure is $2^n$, where n is a counting number that is two or more.

16. The method of claim 9, wherein a maximum number of cycles needed to search for the frame boundary, after an initial syndrome computation, is a number of bits in a frame divided the plurality of syndrome computations in one cycle.

17. A method of computing syndromes for detecting a frame boundary, the method comprising:
    receiving a first word of head bits from a first buffer storing a first received frame;
    receiving a second word of tail bits from a second buffer storing a second received frame; and
    performing a cascaded sequence of syndrome computations using a series of cascaded computation stages, wherein each computation stage receives inputs consisting of corresponding head and tail bits from the first and second words and a preceding syndrome for a candidate frame beginning at the head bit, further wherein the corresponding head and tail bits are separated by one frame length.

18. The method of claim 17, wherein each computation stage comprises a plurality of exclusive-or circuits, each exclusive-or generating a bit of the current syndrome.

19. The method of claim 18, wherein each of the exclusive-or circuits receives at least a first input generated by multiplying the head bit by a corresponding bit from a first predetermined bit sequence, and a second input generated by multiplying the tail bit by a corresponding bit from a second predetermined bit sequence.

20. The method of claim 19, wherein each of the exclusive-or circuits further receives a third input generated by multiplying a last bit of the preceding syndrome by a corresponding bit from a third predetermined bit sequence.

21. The method of claim 20, wherein all but one of the exclusive-or circuits each further receives a fourth input comprising a shifted bit from the preceding syndrome.

22. The method of claim 1, wherein the number of bits in one word is sixty-four, and wherein the number of syndrome computation circuits in the staged-parallel structure is four.

23. The method of claim 1, wherein the number of bits in one word is sixty-four, and wherein the number of syndrome computation circuits in the staged-parallel structure is eight.

* * * * *